(12) United States Patent
Hagiwara

(10) Patent No.: US 7,336,499 B2
(45) Date of Patent: Feb. 26, 2008

(54) FLEXIBLE PRINTED WIRING BOARD

(75) Inventor: Kota Hagiwara, Shimonoseki (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 11/300,399

(22) Filed: Dec. 15, 2005

(65) Prior Publication Data

US 2006/0131064 A1 Jun. 22, 2006

(30) Foreign Application Priority Data

Dec. 16, 2004 (JP) ............................. 2004-364739
Dec. 6, 2005 (JP) ............................. 2005-352611

(51) Int. Cl.
*H05K 1/00* (2006.01)

(52) U.S. Cl. ...................... 361/749; 361/683; 361/686; 361/760; 361/785; 361/803; 174/254; 174/260; 174/266; 174/268; 174/532

(58) Field of Classification Search ................ 361/683, 361/686, 749, 760, 785, 803; 174/254, 260, 174/266, 268, 532; 439/66, 74, 150, 329, 439/493, 519, 608, 862; 29/809, 832, 847, 29/850; 257/E23.065
See application file for complete search history.

(56) References Cited

U.S. PATENT DOCUMENTS

| | | | | |
|---|---|---|---|---|
| 4,742,431 | A * | 5/1988 | Igarashi ....................... | 361/749 |
| 5,288,950 | A * | 2/1994 | Ushio et al. ................. | 174/254 |
| 6,094,354 | A * | 7/2000 | Nakajoh et al. ............. | 361/760 |
| 6,288,444 | B1 * | 9/2001 | Abe et al. .................... | 257/712 |
| 6,341,415 | B2 * | 1/2002 | Amemiya et al. ........ | 29/603.06 |
| 6,559,524 | B2 * | 5/2003 | Seko ........................... | 257/673 |
| 6,617,521 | B1 * | 9/2003 | Saito et al. .................. | 174/260 |
| 6,809,267 | B1 * | 10/2004 | Kurita et al. ................ | 174/254 |
| 7,049,527 | B1 * | 5/2006 | Miyasaka .................... | 174/261 |
| 2002/0043704 | A1 * | 4/2002 | Seko ........................... | 257/678 |
| 2002/0043713 | A1 * | 4/2002 | Seko ........................... | 257/692 |
| 2002/0089634 | A1 * | 7/2002 | Aruga et al. ................. | 349/149 |
| 2004/0004823 | A1 * | 1/2004 | Sakata et al. ................ | 361/795 |
| 2004/0173884 | A1 * | 9/2004 | Kashiwagi et al. ......... | 257/668 |

(Continued)

FOREIGN PATENT DOCUMENTS

JP 09-321083 B2 12/1997

(Continued)

*Primary Examiner*—Dean A. Reichard
*Assistant Examiner*—Xiaoliang Chen
(74) *Attorney, Agent, or Firm*—Sughrue Mion, PLLC

(57) ABSTRACT

An object of the present invention is to provide a flexible printed wiring board which relaxes stress concentration in the flexible printed wiring board during production steps, thereby preventing wire breakage in inner lead portions and cracking in solder resist which would otherwise be caused during mounting of devices such as IC chips and LSI chips. The flexible printed wiring board of the present invention includes an insulating layer; a wiring pattern formed of a plurality of wirings being juxtaposed, which wiring pattern is formed through patterning a conductor layer stacked on at least one surface of the insulating layer and on which wiring pattern a semiconductor chip is to be mounted; and grid-like dummy patterns formed in a blank area where the wiring pattern is not provided, wherein the dummy patterns are formed in a width direction generally symmetrically with respect to the longitudinal direction of the flexible printed wiring board.

8 Claims, 4 Drawing Sheets

U.S. PATENT DOCUMENTS

| | | | |
|---|---|---|---|
| 2004/0174663 A1* | 9/2004 | Itokawa | 361/600 |
| 2005/0039945 A1* | 2/2005 | Matsuda et al. | 174/254 |
| 2005/0133249 A1* | 6/2005 | Fujii | 174/250 |
| 2005/0181541 A1* | 8/2005 | Sakata et al. | 438/117 |
| 2005/0205972 A1* | 9/2005 | Sakata et al. | 257/668 |
| 2006/0065956 A1* | 3/2006 | Awata et al. | 257/668 |
| 2006/0109394 A1* | 5/2006 | Miyagawa et al. | 349/58 |
| 2006/0213684 A1* | 9/2006 | Sakata | 174/258 |

FOREIGN PATENT DOCUMENTS

JP    11-045913 A    2/1999

* cited by examiner

FLEXIBLE PRINTED WIRING BOARD

BACKGROUND OF THE INVENTION

1. Field of the Invention

The present invention relates to a flexible printed wiring board such as a TAB tape or a flexible printed circuit (FPC), which wiring board has wiring patterns and serves as a substrate for supporting semiconductor chips. More particularly, the invention relates to a wide flexible printed wiring board which has a large surface area per wiring pattern and which is used in a plasma display panel (PDP) or a similar device.

2. Description of the Related Art

Development of the electronics industry has been accompanied by sharp demand for printed wiring boards for mounting electronic devices thereon, such as IC (integrated circuit) chips and LSI (large-scale integrated circuit) chips. In the field of plasma display panels (PDPs), wider and more large printed wiring boards are used more than that of liquid crystal devices (LCDs) because the printed wiring boards for PDPs have wider wirings in wider pitch than those for LCDs in order to use e a higher voltage.

Such tape-form flexible printed wiring boards having a large width have drawbacks. For example, the flexible printed wiring boards are deformed during conveyance thereof, particularly uncoiling and coiling up thereof, thereby causing stress concentration in specific portions of the wiring boards. Therefore, after completion of a mounting step such as IC chip bonding, wire breakage in inner lead portions and cracking in solder resist occur.

More specifically, as shown in FIG. 4, after completion of production steps or product inspection, a flexible printed wiring board 1 is guided by means of guide rollers 2 and 3 and then coiled up by a reel 4. During the above conveyance, the flexible printed wiring board 1 is uncoiled to be conveyed in a horizontal direction and, via the guide roller 2, downward to the bottom of a U-shaped section 5, which acts as a buffer section. After passage through the bottom of the U-shaped section 5, the flexible printed wiring board 1 is conveyed upward to the guide roller 3. Since the direction of bending at the guide rollers 2 and 3 differs from that at the U-shaped section 5, stress tends to be concentrated in specific portions. In addition, as shown in FIG. 5, the flexible printed wiring board 1 is generally warped widthwise with the wiring-pattern-provided surface 1a inside. Also, the wider the width of the tape, the higher the degree of warpage. When such warpage is straightened at the guide rollers 2 and 3, stress is also concentrated in specific portions of the flexible printed wiring board 1.

In an attempt to solve the drawbacks of such flexible printed wiring boards, Japanese Patent No. 3350352 (Claims, paragraphs such as [0005]) proposes a carrier tape exhibiting enhanced resistance to stress. In the flexible printed wiring board, wirings provided on the film substrate have almost the same total length of non-parallel sections so as to attain uniform stress resistance in both the center and the periphery of the film.

However, the aforementioned drawbacks in relation to stress concentration are considered to be attributed to marginal portions where no wiring pattern is provided.

In an attempt to prevent generation of cracks and wire breakage in wiring patterns caused by repeated temperature changes effected during device mounting, Japanese Patent Application Laid-Open (kokai) No. 11-45913 (Claims, paragraphs such as [0010] and [0030]) proposes a flexible printed wiring board having a dummy pattern around a device hole, the dummy pattern being electrically unconnected with the wiring pattern. The dummy pattern assumes a shape similar to that of the wiring pattern and is provided such that substantial uniformity in pattern density and thermal expansion coefficient over the film carrier is attained.

However, even when such a dummy pattern is provided, the aforementioned problems in the production of flexible printed wiring boards are not completely solved.

SUMMARY OF THE INVENTION

In view of the foregoing, an object of the present invention is to provide a flexible printed wiring board which relaxes stress concentration in the flexible printed wiring board during production steps, thereby preventing wire breakage in inner lead portions and cracking in solder resist which would otherwise be caused during mounting of devices such as IC chips and LSI chips.

Accordingly, in a first mode of the present invention, there is provided a flexible printed wiring board comprising
  an insulating layer;
  a wiring pattern formed of a plurality of juxtaposed wirings, which wiring pattern is formed through patterning a conductor layer laminated on at least one surface of the insulating layer and on which wiring pattern a semiconductor chip is to be mounted; and
  grid-like dummy patterns formed in a blank area where the wiring pattern is not provided,
  wherein the dummy patterns are formed in a width direction generally symmetrically with respect to the longitudinal direction of the flexible printed wiring board.

In the flexible printed wiring board of the first mode, the grid-like dummy patterns are formed in a width direction generally symmetrically with respect to the longitudinal direction of the flexible printed wiring board. Therefore, the flexible printed wiring board has uniform flexibility, and stress generated, for example, upon straightening or reversing of warpage during conveyance of the wiring board in production thereof is mitigated and released. Thus, there can be prevented wire breakage in inner lead portions and cracking in solder resist, which would otherwise be caused during mounting of devices such as IC chips and LSI chips.

In a second mode of the present invention, each of the grid-like dummy patterns may be provided in a direction of juxtaposition of the juxtaposed wirings.

The flexible printed wiring board of the second mode has grid-like dummy patterns each having wirings which extend in the same direction as the extending direction of wirings forming the wiring pattern. Therefore, more uniform flexibility of the wiring board can be effectively attained, and stress generated, for example, upon straightening or reversing of warpage during conveyance of the wiring board during production thereof is mitigated and released. Thus, there can be prevented wire breakage in inner lead portions and cracking in solder resist, which would otherwise be caused during mounting of devices such as IC chips and LSI chips.

In a third mode of the present invention, the wiring pattern may be formed such that the wirings are provided along the longitudinal direction of the flexible printed wiring board, and the dummy patterns are provided on both sides of the wiring pattern with respect to the direction of juxtaposition of the juxtaposed wirings.

In the flexible printed wiring board of the third mode, rigidity of the blank areas on both sides of the wiring pattern with respect to the direction of juxtaposition of the juxtaposed wirings is controlled, thereby attaining uniform flexibility. Thus, concentrated stress can be effectively relaxed during conveyance of the wiring board in production thereof.

In a fourth mode of the present invention, the flexible printed wiring board may be a wide wiring board having a width of 48 mm or more.

Even though the flexible printed wiring board of the fourth mode has a width of 48 mm or more, concentrated stress can be relaxed during conveyance of the wiring board in production thereof.

In a fifth mode of the present invention, the flexible printed wiring board may be configured such that a device hole is provided in an area where the semiconductor chip is to be mounted, the area corresponding to longitudinal mid portions of the wirings of the wiring pattern, and that a flexural slit is provided for imparting appropriate bending to the board, the flexural slit including a plurality of component slits that are aligned so as to form a row running in a direction of juxtaposition of the juxtaposed wirings, and the flexural slit being provided on at least one of two opposing areas divided by the device hole along the longitudinal direction of the flexible printed wiring board, wherein adjacent component slits are separated from each other by a strut portion therebetween, and the strut portion is disposed away, in the width direction of the flexible printed wiring board, from the position of each end of the device hole with respect to a direction of juxtaposition of the juxtaposed wirings.

In the flexible printed wiring board of the fifth mode, concentration of stress at each end along a long side of the device hole can be prevented during conveyance of the flexible printed wiring board. Stress concentration in the inner leads provided along the device hole upon bending can be relaxed through the flexural slit(s).

In a sixth mode of the present invention, each of the dummy patterns may be separated by the mediation of an area where the flexural slit has been provided.

In the flexible printed wiring board of the sixth mode, a dummy pattern is provided in each of the areas separated by the mediation of the flexural slit(s), whereby stress concentration can be effectively prevented.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Embodiments of the flexible printed wiring board of present invention will next be described. Needless to say, the present invention is not limited to the below-described production methods and modes of use.

Embodiment 1

Figure 1:
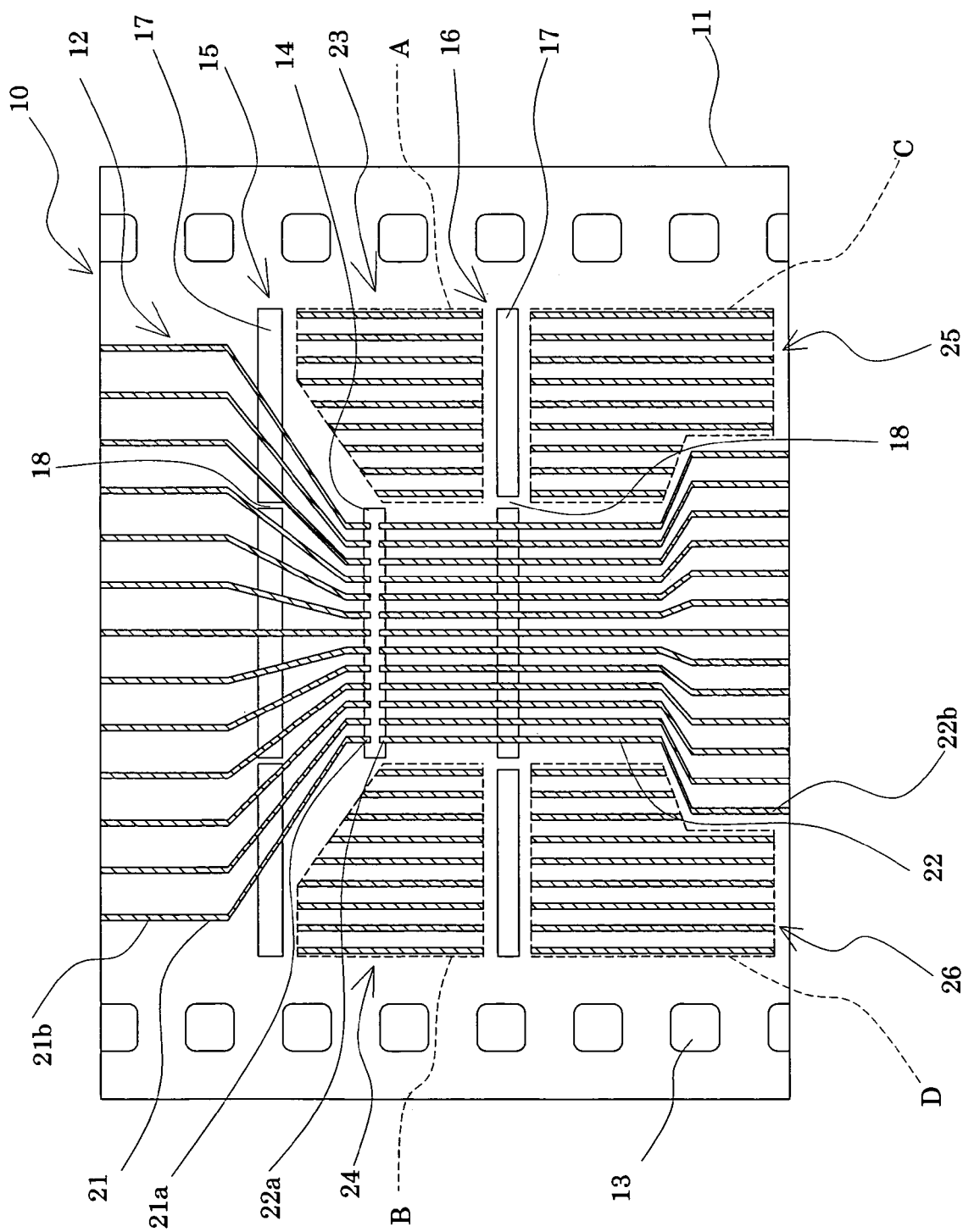
FIG. 1 is a schematic plan view of a film carrier tape (3-layer TAB tape) according to Embodiment 1 of the present invention.

FIG. 1 schematically shows a plan view of a flexible printed wiring board of Embodiment 1. Although FIG. 1 shows a portion of the flexible printed wiring board corresponding to one film carrier product, a flexible printed wiring board is generally produced in a continuous manner as a long tape product. In general production steps, electronic devices such as IC chips are mounted on a tape substrate while the tape substrate is conveyed. In some cases, the device-mounted tape substrate is cut to provide product pieces, and in other cases, the tape substrate is cut, followed by mounting device chips. Hereinafter, the embodiment will be described, taking a tape-form flexible printed wiring board as an example.

The flexible printed wiring board 10 of Embodiment 1 shown in FIG. 1 is a TAB tape formed of a tape-form insulating film 11 and a plurality of wiring patterns 12 which are continuously formed on one surface of the insulating film. As shown in FIG. 1, the insulating film 11 has, along longitudinal edges thereof, rows of sprocket holes 13 for conveying the film at predetermined intervals, and also has a device hole 14 in an area where an electronic device is to be mounted. In addition, the board has flexural slits 15 and 16 which are provided at specific positions on both sides of the device hole 14 with respect to the longitudinal direction of the tape. The flexural slits 15 and 16 are provided for regulating flexibility, and each flexural slit is formed of a plurality of component slits 17 (3 component slits in Embodiment 1) extending in the width direction of the tape and connected with one another by the mediation of narrow strut portions 18. The flexural slits 15 and 16 may be provided on one side of the device hole 14, or may be omitted.

The wiring pattern 12 has a plurality of wirings which extend in the longitudinal direction of the tape. In Embodiment 1, the segments of the wirings extending from the upper section of FIG. 1 to the device hole 14 are referred to as output wirings 21, whereas the segments of the wirings extending from the device hole 14 to the lower section of FIG. 1 are referred to as input wirings 22. Terminal portions of wirings 21 and 22 which abut the device hole 14 are referred to as inner leads 21a and 22a, respectively, whereas those extending to the tape segment edges are referred to as outer leads 21b and 22b, respectively. Generally, the areas other than the inner and outer leads are covered with a solder resist layer (not illustrated).

In the flexible printed wiring board 10 of the present invention, dummy patterns 23 to 26 whose dummy wirings extend in a grid-like manner in the longitudinal direction of the tape are provided in blank areas A to D, which are present on both sides of the wiring pattern 12 in the width direction of the tape. The dummy patterns 23 to 26 are formed from the conductor layer, which provides the wiring pattern 12. The dummy wirings of the dummy patterns 23 to 26 are not electrically connected with the wiring pattern 12. The dummy patterns 23 to 26 may or may not be covered with a solder resist layer.

No particular limitation is imposed on the areas where the dummy patterns 23 to 26 are to be provided and on the width and pitch of the dummy wirings, and these conditions may be appropriately predetermined in consideration of the shape of the wiring pattern 12 and wiring density. Specifically, the width and pitch of the dummy wirings are not particularly limited, so long as the wiring pattern 12 and the dummy patterns 23 to 26, as a whole, provide rigidity, particularly in the width direction, of the highest possible degree of uniformity.

The insulating film 11 employed in the present invention may be formed from a material having flexibility as well as resistance to chemicals and heat. Examples of such a material for providing the insulating film 11 include polyester, polyamide, polyimide, BT resin, and liquid crystal polymers. Among them, an aromatic polyimide (all repeating units being aromatic) having a biphenyl skeleton (e.g., Upilex, product of Ube Industries, Ltd.) is preferred. The insulating film 11 generally has a thickness of 25 to 125 μm, preferably 50 to 75 μm.

The wiring patterns 12 are provided on one side of the insulating film 11 having the device hole 14 and the sprocket holes 13 and generally have been fabricated by patterning a conductor layer formed of conductor foil of copper or aluminum. Such a conductor layer may be directly laminated on the insulating film 11, or may be formed through pressing (e.g., thermal pressing) by the mediation of an adhesive layer. The conductor layer has a thickness of, for example, 6 to 70 μm, preferably 8 to 35 μm. The conductor layer is formed of conductor foil, preferably copper foil.

Rather than provision of a conductor foil on the insulating film 11, an insulator material, such as a polyimide precursor, is applied to a conductor foil, followed by heating so as to form an insulating film made of polyimide.

The conductor layer provided on the insulator film 11 is patterned through photolithography. Specifically, a photoresist is applied to the upper surface of the conductor layer and is subjected to light exposure and development. The conductor layer is etched (chemically dissolved) with an etchant through a patterned photoresist layer serving as a photomask. The remaining photoresist is removed through dissolution with an alkaline liquid or similar material, thereby patterning the conductor layer to form the wiring pattern 12 on the insulating film. During the above steps, the dummy patterns 23 to 26 are also formed.

On the wiring pattern 12, a tin plate layer or a similar layer is formed in accordance with needs. In some cases, a metallic layer (e.g., a nickel plate layer or a gold plate layer) is formed on the inner leads 21a and 22a and the outer leads 21b and 22b, depending on the conditions under which connection with electronic devices or other devices is performed. However, provision of the aforementioned metallic layer is not essential in the present invention, and should not be construed as limiting the invention thereto. Needless to say, the dummy patterns 23 to 26 may be formed exclusively of the conduct layer without plating, or may also be formed of a plated conduct layer.

As described hereinabove, in the flexible printed wiring board 10 of Embodiment 1, grid-like dummy patterns 23 to 26 extending in the longitudinal direction of the tape are provided in blank areas A to D, which are present on both sides of the wiring pattern 12 in the width direction of the tape. Therefore, almost uniform rigidity of the tape in the width direction is attained. In other words, uniformity in flexibility is attained, thereby reducing warpage. According to the present invention, the tape has more uniform flexibility, as compared with the case in which the blank areas A to D are completely covered with a conductor layer (i.e., solid-coated), with the conductor layer not having been patterned. Thus, even when the warpage is straightened or reversed during conveyance of the tape in production and inspection steps, stress concentration is prevented. Accordingly, during mounting of electronic devices such as IC chips and LSI chips, wire breakage in the inner leads 21a and 22a and cracking in solder resist can be prevented.

Embodiment 2

Figure 2:
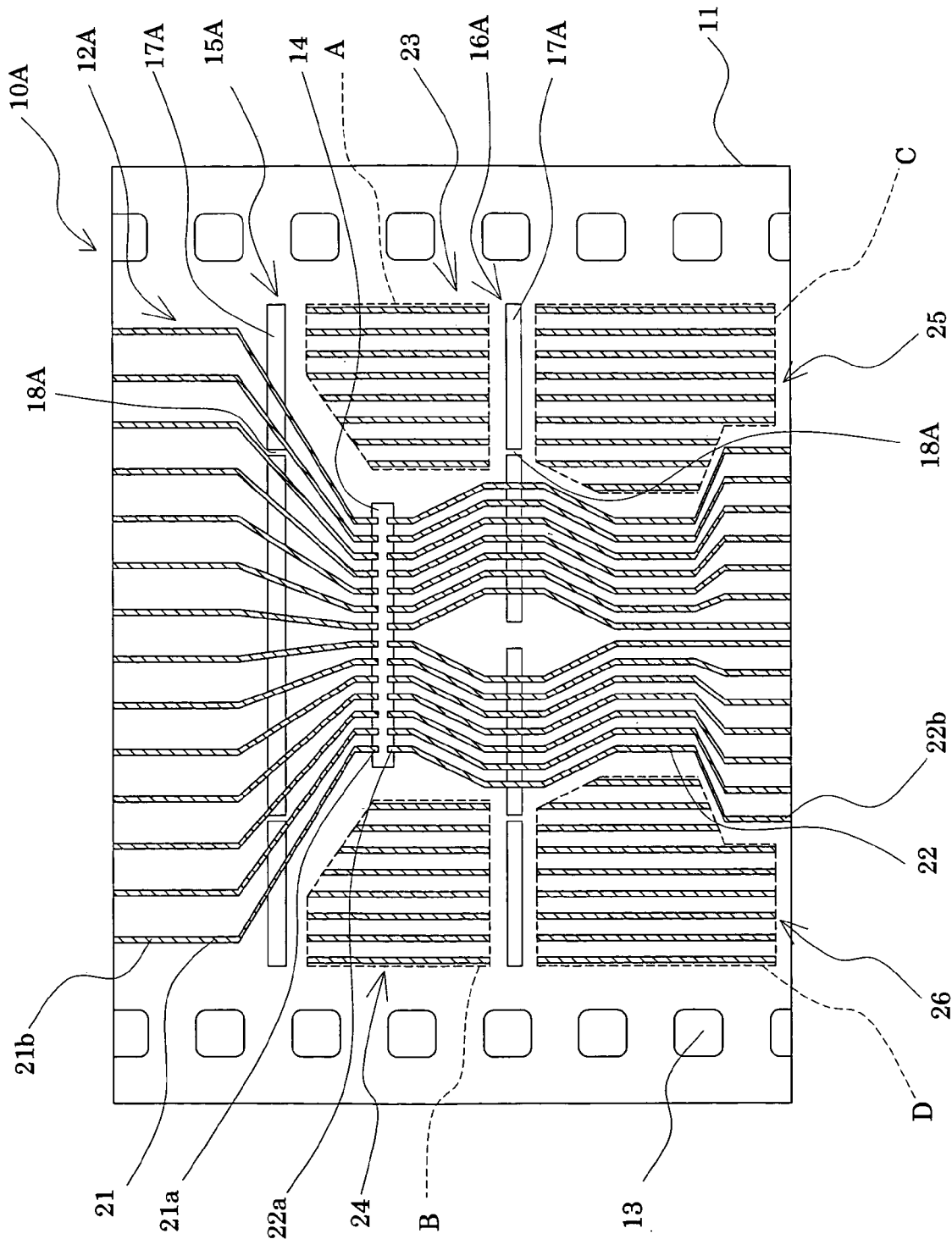
FIG. 2 is a schematic plan view of a film carrier tape (3-layer TAB tape) according to Embodiment 2 of the present invention.

FIG. 2 schematically shows a plan view of a flexible printed wiring board of Embodiment 2. The same members as shown in FIG. 1 are denoted with the same reference numerals, and repeated descriptions are omitted.

The flexible printed wiring board 10A of Embodiment 2 has a wiring pattern 12A, which is slightly different in shape from the wiring pattern 12 of Embodiment 1.

Furthermore, Embodiment 2 differs from Embodiment 1 in that each of the strut portions 18A in flexural slits 15A and 16A is provided such that the strut portion is shifted, in the width direction of the tape, from the position of each end of the device hole 14 in the width direction of the tape. Specifically, in Embodiment 1, each strut portion 18 in the flexural slits 15 and 16 is provided such that the position of each device hole 14 end almost coincides, in the width direction of the tape, with that of the strut portion, whereas in Embodiment 2, strut portions and device hole ends are arranged so as not to be aligned in the longitudinal direction of the tape. Through employment of this configuration, even when the warpage is straightened or reversed during conveyance of the tape, stress concentration in the portions surrounding each end of the device hole 14 in the width direction of the tape is prevented. In addition, even when the tape is bent at the flexural slits 15A and 16A, stress concentration in the inner leads 21a and 22a is effectively prevented.

Embodiment 3

Figure 3:
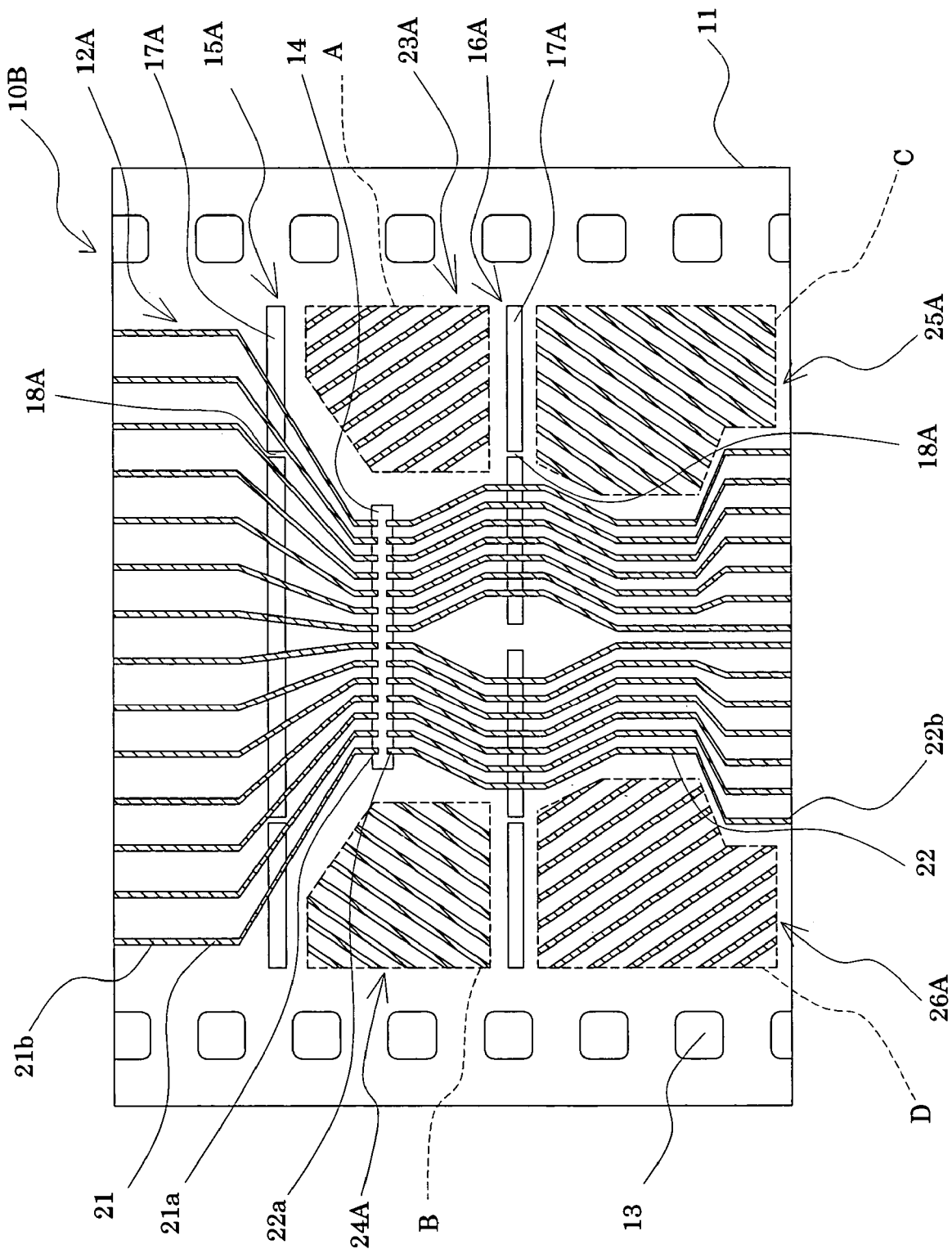
FIG. 3 is a schematic plan view of a film carrier tape (3-layer TAB tape) according to Embodiment 3 of the present invention.
Figure 4:
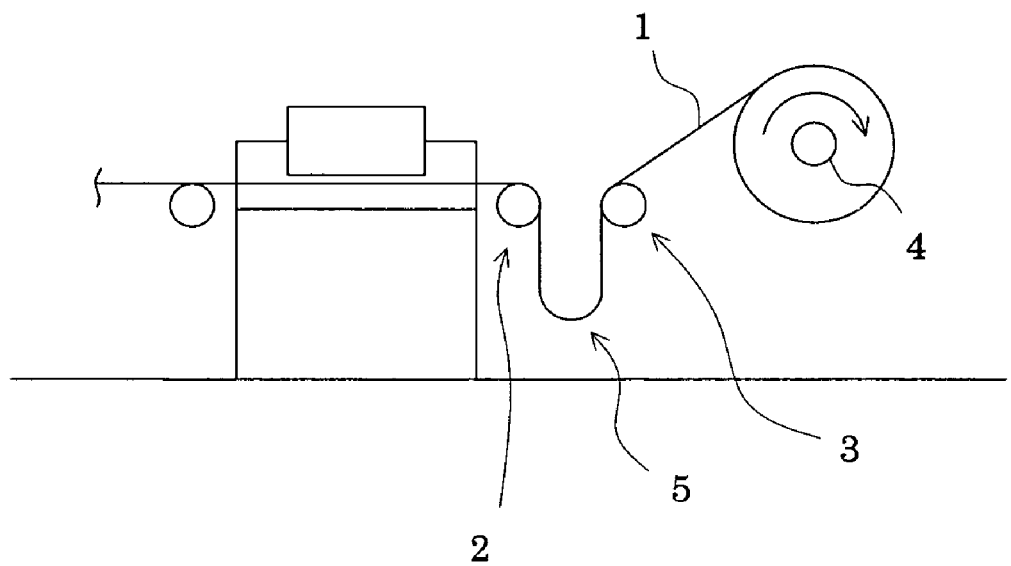
FIG. 4 is a sketch showing production of a flexible printed wiring board.
Figure 5:
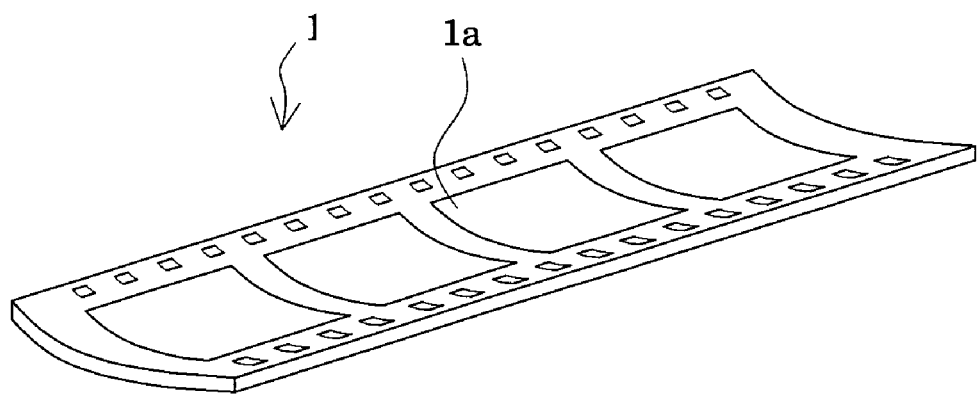
FIG. 5 is a sketch showing warpage of a flexible printed wiring board.

FIG. 3 schematically shows a plan view of a flexible printed wiring board of Embodiment 3. The same members as shown in FIG. 2 are denoted with the same reference numerals, and repeated descriptions are omitted.

The flexible printed wiring board 10B of Embodiment 3 has dummy patterns 23A to 26A, which are slightly different in pattern shape from the dummy patterns 23 to 26 of Embodiment 2.

In the dummy patterns 23A to 26A, dummy wirings thereof extending in a grid-like manner in an oblique direction with respect to the longitudinal direction of the tape are provided in blank areas A to D, which are present on both sides of the wiring pattern 12A in the width direction of the tape. The dummy patterns 23A and 24A (also 25A and 26A) have oblique angles different from each other and have been formed from dummy wirings having such oblique angles that the wirings are arranged with linear symmetry with respect to the longitudinal direction of the tape. Through employment of this configuration, almost uniform rigidity of the tape in the width direction is attained. In Embodiment 3, the oblique angles of dummy wirings are different between the dummy patterns 23A and 25A (also 24A and 26A). However, dummy wirings may be arranged in the same direction between two dummy patterns, so long as the dummy patterns are provided with line symmetry with respect to the longitudinal direction of the tape. No particular limitation is imposed on the oblique angles of dummy wirings.

Similar to Embodiments 2 and 3, no particular limitation is imposed on the areas where the dummy patterns 23A to 26A are to be provided and on the width and pitch of the dummy wirings, and these conditions may be appropriately predetermined in consideration of the shape of the wiring pattern 12A and wiring density. Specifically, the width and pitch of the dummy wirings are not particularly limited, so long as the wiring pattern 12A and the dummy patterns 23A to 26A, as a whole, provide rigidity, in the width direction, of the highest possible degree of uniformity.

Other Embodiments

In the aforementioned embodiments, the wirings are juxtaposed in the width direction of the tape. However, the wirings may be juxtaposed in the longitudinal direction of the tape, or juxtaposed in an oblique manner with respect to the longitudinal direction of the tape. In these cases, when grid-like dummy patterns are provided in a width direction with respect to the longitudinal direction of the wirings, particularly on both sides of the wiring pattern, the same effects of the present invention can be attained.

In the aforementioned embodiments, one unit of the flexible printed wiring board has one device hole. However, needless to say, cases in which one wiring board unit has two or more device holes also fall within the scope of the present invention.

EXAMPLES

Example 1

A flexible printed wiring board (3-layer TAB tape) having a structure similar to that of the flexible printed wiring board of Embodiment 1 was produced. The thus-produced flexible printed wiring board had a tape width of 70 mm and a tape length per film carrier unit of 57 mm. The output outer leads 21*b* were formed from 400 lead wirings (pitch: 80 μm), whereas the input outer leads 22*b* were formed from 200 lead wirings (pitch: 250 μm). Also, the output inner leads 21*a* were formed from 400 lead wirings (pitch: 60 μm), whereas the input inner leads 22*a* were formed from 200 lead wirings (pitch: 80 μm). Each of the dummy patterns 23 to 26 was formed from 30 dummy wirings (pitch: 750 μm).

Example 2

The procedure of Example 1 was repeated, except that the structure of Embodiment 2 was employed, to thereby produce a flexible printed wiring board.

Comparative Example 1

The procedure of Example 1 was repeated, except that the unpatterned conductor layer, was left in the areas corresponding to the dummy patterns 23 to 26, to thereby produce a flexible printed wiring board.

Comparative Example 2

The procedure of Example 2 was repeated, except that the unpatterned conductor layer was left in the areas corresponding to the dummy patterns 23 to 26, to thereby produce a flexible printed wiring board.

Comparative Example 3

The procedure of Example 1 was repeated, except that the conductor layer was completely removed in the areas corresponding to the dummy patterns 23 to 26, to thereby produce a flexible printed wiring board.

Comparative Example 4

The procedure of Example 2 was repeated, except that the conductor layer was completely removed in the areas corresponding to the dummy patterns 23 to 26, to thereby produce a flexible printed wiring board.

Test Example

Each of the flexible printed wiring boards of the Examples and the Comparative Examples was produced as a 125-m length tape, and IC chips were mounted on the tape. After mounting, all products were inspected for wire breakage by checking electric conduction. Incidence of wire breakage was calculated on the basis of the following formula:

Incidence of wire breakage (%)=100×(count of defective products)/(total number of inspected samples).

The results are shown in Table 1.

TABLE 1

| | Space | Positions of strut portion and device hole end | Incidence of wire breakage (%) |
|---|---|---|---|
| Ex. 1 | dummy pattern | aligned flush | 1.6 |
| Ex. 2 | dummy pattern | offset | 0 |
| Comp. Ex. 1 | non-patterned conductor layer | aligned flush | 5.3 |
| Comp. Ex. 2 | non-patterned conductor layer | offset | 3.4 |
| Comp. Ex. 3 | none | aligned flush | 4.8 |
| Comp. Ex. 4 | none | offset | 3.1 |

As is clear from Table 1, the flexible printed wiring board of Example 2, in which the dummy patterns 23 to 26 were provided and each of the strut portions 18 in the flexural slits 15A and 16A was provided such that the strut portion is shifted, in the width direction of the tape, from the position of each end of the device hole 14, exhibited no wire breakages. The flexible printed wiring board of Example 1, in which the dummy patterns 23 to 26 were provided but the position of each strut portion 18 is not shifted, exhibited an incidence of wire breakage as remarkably low as 1.6%.

In contrast, the flexible printed wiring boards of Comparative Examples 1 and 2, in which no dummy pattern was provided and an unpatterned conductor layer was left, and the flexible printed wiring boards of Comparative Examples 3 and 4, in which the conductor layer was completely removed from the areas where the dummy patterns were to be formed, exhibited an incidence of wire breakage as high as 3% or higher, due to lack of uniformity in rigidity.

In the flexible printed wiring board of the present invention, grid-like dummy patterns are formed in a width-direction generally symmetrically with respect to the longitudinal direction of the flexible printed wiring board. Therefore, the flexible printed wiring board has uniform flexibility, and stress generated, for example, at straightening or reversing of warpage during conveyance of the wiring board during production thereof is mitigated and released. Thus, wire breakage in inner lead portions and cracking in solder resist which would otherwise be caused during mounting of devices such as IC chips and LSI chips can be prevented.

What is claimed is:

1. A flexible printed wiring board comprising
an insulating layer;
a wiring pattern formed of a plurality of juxtaposed wirings, which wiring pattern is formed through patterning a conductor layer stacked on at least one surface of the insulating layer and on which wiring pattern a semiconductor chip is to be mounted; and
grid-like dummy patterns formed in a blank area where the wiring pattern is not provided,
wherein the dummy patterns are formed in a width direction generally symmetrically with respect to the longitudinal direction of the flexible printed wiring board, which is configured such that
a device hole is provided in an area where the semiconductor chip is to be mounted, the area corresponding to longitudinal mid portions of the wirings of the wiring pattern, and
that a flexural slit is provided for imparting appropriate bending to the board, the flexural slit including a plurality of component slits that are aligned so as to form a row running in a direction of juxtaposition of the juxtaposed wirings, and the flexural slit being provided on at least one of two opposing areas divided by the device hole along the longitudinal direction of the flexible printed wiring board,
wherein adjacent component slits are separated from each other by a strut portion therebetween, and the strut portion is disposed away, in the width direction of the flexible printed wiring board, from the position of each end of the device hole with respect to a direction of juxtaposition of the juxtaposed wirings.

2. A flexible printed wiring board comprising
an insulating layer;
a wiring pattern formed of a plurality of juxtaposed wirings, which wiring pattern is formed through patterning a conductor layer stacked on at least one surface of the insulating layer and on which wiring pattern a semiconductor chip is to be mounted; and
grid-like dummy patterns formed in a blank area where the wiring pattern is not provided,
wherein the dummy patterns are formed in a width direction generally symmetrically with respect to the longitudinal direction of the flexible printed wiring board,
and wherein each of the grid-like dummy patterns are provided in a direction of juxtaposition of the juxtaposed wirings, which is configured such that
a device hole is provided in an area where the semiconductor chip is to be mounted, the area corresponding to longitudinal mid portions of the wirings of the wiring pattern, and
that a flexural slit is provided for imparting appropriate bending to the board, the flexural slit including a plurality of component slits that are aligned so as to form a row running in a direction of juxtaposition of the juxtaposed wirings, and the flexural slit being provided on at least one of two opposing areas divided by the device hole along the longitudinal direction of the flexible printed wiring board,
wherein adjacent component slits are separated from each other by a strut portion therebetween, and the strut portion is disposed away, in the width direction of the flexible printed wiring board, from the position of each end of the device hole with respect to a direction of juxtaposition of the juxtaposed wirings.

3. A flexible printed wiring board comprising
an insulating layer;
a wiring pattern formed of a plurality of juxtaposed wirings, which wiring pattern is formed through patterning a conductor layer stacked on at least one surface of the insulating layer and on which wiring pattern a semiconductor chip is to be mounted; and
grid-like dummy patterns formed in a blank area where the wiring pattern is not provided,
wherein the dummy patterns are formed in a width direction generally symmetrically with respect to the longitudinal direction of the flexible printed wiring board,
and wherein the wiring pattern is formed such that the wirings are provided along the longitudinal direction of the flexible printed wiring board, and the dummy patterns are provided on both sides of the wiring pattern with respect to the direction of juxtaposition of the juxtaposed wirings, which is configured such that
a device hole is provided in an area where the semiconductor chip is to be mounted, the area corresponding to longitudinal mid portions of the wirings of the wiring pattern, and
that a flexural slit is provided for imparting appropriate bending to the board, the flexural slit including a plurality of component slits that are aligned so as to form a row running in a direction of juxtaposition of the juxtaposed wirings, and the flexural slit being provided on at least one of two opposing areas divided by the device hole along the longitudinal direction of the flexible printed wiring board,
wherein adjacent component slits are separated from each other by a strut portion therebetween, and the strut portion is disposed away, in the width direction of the flexible printed wiring board, from the position of each end of the device hole with respect to a direction of juxtaposition of the juxtaposed wirings.

4. A flexible printed wiring board comprising
an insulating layer;
a wiring pattern formed of a plurality of juxtaposed wirings, which wiring pattern is formed through patterning a conductor layer stacked on at least one surface of the insulating layer and on which wiring pattern a semiconductor chip is to be mounted; and
grid-like dummy patterns formed in a blank area where the wiring pattern is not provided,
wherein the dummy patterns are formed in a width direction generally symmetrically with respect to the longitudinal direction of the flexible printed wiring board,
and which flexible printed wiring board is a wide wiring board having a width of 48 mm or more, which is configured such that
a device hole is provided in an area where the semiconductor chip is to be mounted, the area corresponding to longitudinal mid portions of the wirings of the wiring pattern, and
that a flexural slit is provided for imparting appropriate bending to the board, the flexural slit including a plurality of component slits that are aligned so as to form a row running in a direction of juxtaposition of the juxtaposed wirings, and the flexural slit being provided on at least one of two opposing areas divided by the device hole along the longitudinal direction of the flexible printed wiring board, wherein adjacent component slits are separated from each other by a strut portion therebetween, and the strut portion is disposed away, in the width direction of the flexible printed wiring board, from the position of each end of the device hole with respect to a direction of juxtaposition of the juxtaposed wirings.

5. A flexible printed wiring board according to claim 1, wherein each of the dummy patterns is separated by the mediation of an area where the flexural slit has been provided.

6. A flexible printed wiring board according to claim 2, wherein each of the dummy patterns is separated by the mediation of an area where the flexural slit has been provided.

7. A flexible printed wiring board according to claim 3, wherein each of the dummy patterns is separated by the mediation of an area where the flexural slit has been provided.

8. A flexible printed wiring board according to claim 4, wherein each of the dummy patterns is separated by the mediation of an area where the flexural slit has been provided.

* * * * *